United States Patent
Lin et al.

(10) Patent No.: US 12,057,162 B2
(45) Date of Patent: Aug. 6, 2024

(54) MEMORY DEVICE FOR IN-MEMORY COMPUTING, COMPUTING METHOD AND COMPUTING CELL THEREOF

(71) Applicant: MACRONIX INTERNATIONAL CO., LTD., Hsinchu (TW)

(72) Inventors: Yu-Yu Lin, New Taipei (TW); Feng-Min Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 223 days.

(21) Appl. No.: 17/929,318

(22) Filed: Sep. 2, 2022

(65) Prior Publication Data

US 2024/0079055 A1    Mar. 7, 2024

(51) Int. Cl.
    *G11C 16/04*        (2006.01)
    *G11C 13/00*        (2006.01)
    *G11C 16/10*        (2006.01)
    *H03K 19/20*       (2006.01)

(52) U.S. Cl.
    CPC ......... *G11C 13/0002* (2013.01); *H03K 19/20* (2013.01)

(58) Field of Classification Search
CPC ... G11C 13/0002; G11C 7/1006; G11C 11/54; G11C 16/0483; H03K 19/20
See application file for complete search history.

(56) References Cited

U.S. PATENT DOCUMENTS

| | | | |
|---|---|---|---|
| 11,423,983 B2 | 8/2022 | Lin et al. | |
| 2019/0286419 A1* | 9/2019 | Lin ................... | G11C 13/0004 |
| 2021/0064367 A1 | 3/2021 | Kim | |
| 2021/0342668 A1 | 11/2021 | Malik | |
| 2021/0365241 A1 | 11/2021 | Huang | |
| 2022/0068379 A1* | 3/2022 | Kim ..................... | G11C 13/004 |
| 2022/0101119 A1* | 3/2022 | Tiku ...................... | G06N 3/063 |
| 2022/0158651 A1 | 5/2022 | Chao | |
| 2023/0068645 A1* | 3/2023 | Fujiwara ................ | G06F 7/501 |
| 2023/0267979 A1* | 8/2023 | Fujiwara ................ | G11C 7/106 |
| | | | 365/233.1 |

FOREIGN PATENT DOCUMENTS

| TW | 202117714 A | 5/2021 |
|---|---|---|
| TW | 202228128 A | 7/2022 |

\* cited by examiner

*Primary Examiner* — Hien N Nguyen
(74) *Attorney, Agent, or Firm* — McClure, Qualey & Rodack, LLP

(57) ABSTRACT

An in-memory-computing method for a memory device includes: storing weight values in cascaded computing cells each including first and second computing memory cells, wherein the first computing memory cells are cascaded in series into a first computing memory cell string and the second computing memory cells are cascaded in series into a second computing memory cell string: receiving input values by the first and the second computing memory cell strings; performing a first logic operation on the input values and the weight values by the first computing memory cell string to generate a first logic operation result, and performing a second logic operation on the input values and the weight values by the second computing memory cell string to generate a second logic operation result: and performing a third logic operation on the first and the second logic operation results to generate an output logic operation result.

12 Claims, 7 Drawing Sheets

MEMORY DEVICE FOR IN-MEMORY COMPUTING, COMPUTING METHOD AND COMPUTING CELL THEREOF

TECHNICAL FIELD

The application relates to a memory device for in-memory computing (IMC), a computing method and a computing cell thereof.

BACKGROUND

With the evolution of semiconductor technology, memory devices are often used to perform in-memory computing (IMC). Moreover, with the evolution of artificial intelligence (AI) technology, in-memory computing performed by the memory device often includes exclusive nor (XNOR) logic operations, exclusive OR (XOR) logic operations, XNAND logic operations, XAND logic operations and so on.

However, if the memory device, which is capable of executing logic operations, has high circuit complexity and high power consumption, then the operations of artificial intelligence (AI) technology are negatively affected.

Therefore, there needs an improved memory device for in-memory computing (IMC), a computing method and a computing cell thereof, which reduces circuit complexity and power consumption in executing logic operations.

SUMMARY

According to one embodiment, provided is a memory device, comprising: a memory array including a plurality of cascaded computing cell, each of the computing cells including a first computing memory cell and a second computing memory cell coupled to the first computing memory cell, wherein the first computing memory cells of the computing cells are cascaded in series into a first computing memory cell string and the second computing memory cells of the computing cells are cascaded in series into a second computing memory cell string; and a logic circuit coupled to the memory array. The logic circuit is configured for: storing a plurality of weight values in the first computing memory cell string and the second computing memory cell string; receiving a plurality of input values by the first computing memory cell string and the second computing memory cell string; performing a first logic operation on the input values and the weight values by the first computing memory cell string to generate a first logic operation result, and performing a second logic operation on the input values and the weight values by the second computing memory cell string to generate a second logic operation result; and performing a third logic operation on the first logic operation result and the second logic operation result to generate an output logic operation result.

According to another embodiment, provided is an in-memory-computing (IMC) method for a memory device. The IMC method includes: storing a plurality of weight values in a plurality of cascaded computing cells, each of the computing cells including a first computing memory cell and a second computing memory cell coupled to the first computing memory cell, wherein the first computing memory cells of the computing cells are cascaded in series into a first computing memory cell string and the second computing memory cells of the computing cells are cascaded in series into a second computing memory cell string; receiving a plurality of input values by the first computing memory cell string and the second computing memory cell string; performing a first logic operation on the input values and the weight values by the first computing memory cell string to generate a first logic operation result, and performing a second logic operation on the input values and the weight values by the second computing memory cell string to generate a second logic operation result; and performing a third logic operation on the first logic operation result and the second logic operation result to generate an output logic operation result.

According to another embodiment, provided is a computing cell of a memory device, the computing cell including: a first and a second computing memory cells coupled to each other, wherein the first and the second computing memory cells both receive an input voltage corresponding to an input value; a threshold voltage of the first computing memory cell has a first threshold voltage or a third threshold voltage, and a threshold voltage of the second computing memory cell has the third threshold voltage or a second threshold voltage, wherein the second threshold voltage is higher than the third threshold voltage, the third threshold voltage is higher than the first threshold voltage; both the first and the second computing memory cells store a weight value, the weight value corresponding to the respective threshold voltages of the first and the second computing memory cells; the first computing memory cell performs a first logic operation on the input value and the weight value to generate a first logic operation result, the second computing memory cell performs a second logic operation on the input value and the weight value to generate a second logic operation result, a third logic operation is performed on the first logic operation result and the second logic operation result to generate an output logic operation result.

Figure 1A:
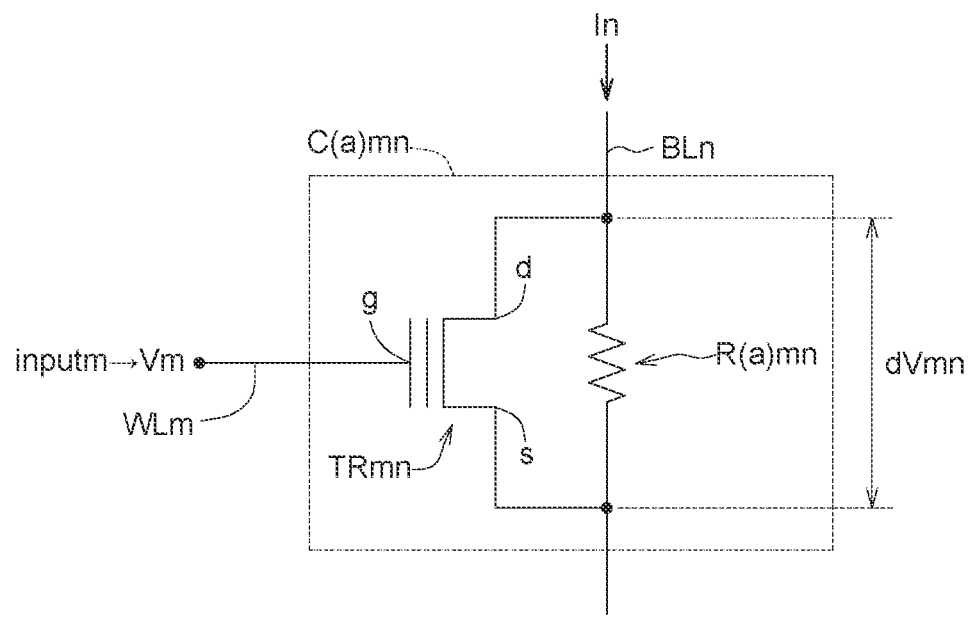
FIG. 1A shows a circuit diagram of a computing memory cell C(a)mn according to one embodiment of the application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

One embodiment of the application discloses a memory device for in-memory computing (IMC), a computing method and a computing cell thereof, which is capable of executing exclusive nor (XNOR) logic operations, exclusive OR (XOR) logic operations, XNAND logic operations, XAND logic operations and so on in artificial intelligence (AI) technology.

One embodiment of the application discloses a memory device for in-memory computing (IMC), a computing method and a computing cell thereof, which may be NAND structure or XOR structure.

FIG. 1A shows a circuit diagram of a computing memory cell $C(a)mn$ according to one embodiment of the application. The computing memory cell $C(a)mn$ includes a transistor $TRmn$ and a resistor $R(a)mn$. The transistor $TRmn$ is coupled to the resistor $R(a)mn$ in parallel, and the resistor $R(a)mn$ has a changeable resistance value. The computing memory cell $C(a)mn$ is coupled to an n-th bit lie $BLn$ and an m-th word line $WLm$. The transistor $TRmn$ has a drain terminal d and a source terminal s coupled to the bit line $BLn$ and a gate terminal g coupled to the word line $WLm$. The resistor $R(a)mn$ is coupled to the bit line $BLn$.

The transistor $TRmn$ is for example but not limited by a floating gate transistor, a mask ROM, an Erasable Programmable Read Only Memory (EPROM), an Electrically-Erasable Programmable Read-Only Memory (EEPROM), a Silicon-Oxide-Nitride-Oxide-Silicon (SONGS) memory and so on. The transistor $TRmn$ has a threshold voltage $Vt$ and a programming voltage is applied to adjust the threshold voltage $Vt$. When the transistor $TRmn$ is at the erase state, the threshold voltage $Vt$ is a first threshold voltage $VtL$. When the transistor $TRmn$ is at the programing state, the threshold voltage $Vt$ is a second threshold voltage $VtH$. The second threshold voltage $VtH$ is higher than the first threshold voltage $VtL$. The first threshold voltage $VtL$ is for example but not limited by 0.4V and the second threshold voltage $VtH$ is for example but not limited by 4.8V. Further, the threshold voltage $Vt$ is corresponding to the weight value $Wmn$ stored in the computing memory cell $C(a)mn$. When the threshold voltage $Vt$ is the first threshold voltage $VtL$, the computing memory cell $C(a)mn$ stores the weight value $Wmn$ as logic "0". When the threshold voltage $Vt$ is the second threshold voltage $VtH$, the computing memory cell $C(a)mn$ stores the weight value $Wmn$ as logic "1".

The gate g of the transistor $TRmn$ receives the input voltage $Vm$ via the word line $WLm$. The input voltage $Vm$ is corresponding to the input value $inputm$ received by the computing memory cell $C(a)mn$. When the input voltage $Vm$ is a first input voltage $VL$, the input value $inputm$ is logic "1". When the input voltage $Vm$ is a second input voltage $VH$, the input value $inputm$ is logic "0". The second input voltage $VH$ is higher than the first input voltage $VL$. The second input voltage $VH$ is for example but not limited by 3V. The first input voltage $VL$ is for example but not limited by −1V. Further, the second input voltage $VH$ is higher than the second threshold voltage $VtH$ and the first threshold voltage $VtL$. Further, the first input voltage $VL$ is lower than the second threshold voltage $VtH$ but higher than the first threshold voltage $VtL$.

The computing memory cell $C(a)mn$ may receive the sensing current $In$ through the bit line $BLn$. The sensing current $In$ may flow through the transistor $TRmn$ and/or the resistor $R(a)mn$, so that the computing memory cell $C(a)mn$ generates a voltage difference $dVmn$ between the drain d and the source s of the transistor $TRmn$. The voltage difference $dVmn$ is the output voltage of the computing memory cell $C(a)mn$, and the voltage difference $dVmn$ corresponds to the output value $Yn$ of the computing memory cell $C(a)mn$. In operation, in response to the input voltage $Vm$ and the threshold voltage $Vt$ of different voltage values, the computing memory cell $C(a)mn$ may generate the voltage difference $dVmn$ of different voltage values and the corresponding output value $Yn$. Table 1-1 shows the voltage difference $dVmn$ generated by the computing memory cell $C(a)mn$ and the corresponding output value $Yn$ when different input voltages $Vm$ and threshold voltages $Vt$ are provided.

TABLE 1-1

|  | $Vt = VtL$ $Wmn = 0$ | | $Vt = VtH$ $Wmn = 1$ | |
| --- | --- | --- | --- | --- |
|  | dVmn | Yn | dVmn | Yn |
| $Vm(=VH) > VtH > VtL$ $inputm = 0$ | dVs | 0 | dVs | 0 |
| $VtH > Vm(=VL) > VtL$ $inputm = 1$ | dVs | 0 | dVL | 1 |

Referring to Table 1-1, when the input voltage $Vm$ received by the computing memory cell $C(a)mn$ is the second input voltage $VH$, and the threshold voltage $Vt$ of the transistor $TRmn$ is the first threshold voltage $VtL$ or the second threshold voltage $VtH$, since the input voltage $Vm$ is greater than the threshold voltage $Vt$, the transistor $TRmn$ is in a turned-on (i.e., a conducting state). In this case, the sensing current $In$ may flow through the transistor $TRmn$ and the resistor $R(a)mn$, and the equivalent impedance of the computing memory cell $C(a)mn$ is the equivalent resistance value $Rtr$ of the transistor $TRmn$ itself in parallel with the resistor $R(a)mn$. In one example, the resistance value of the resistor $R(a)mn$ is much greater than the equivalent resistance value $Rtr$ of the transistor $TRmn$, so the equivalent impedance of the computing memory cell $C(a)mn$ is substantially equal to the equivalent resistance value $Rtr$ of the transistor $TRmn$. Accordingly, the voltage difference $dVmn$ generated by the computing memory cell $C(a)mn$ is the first voltage difference $dVs$, and the first voltage difference $dVs$ is substantially equal to a product of the current value of the sensing current $In$ and the equivalent resistance value $Rtr$ of the transistor $TRmn$, as shown in equation (1). Since the equivalent resistance value $Rtr$ of the transistor $TRmn$ is very small, the voltage value of the first voltage difference $dVs$ is very small (i.e., approaching 0V). The output value $Yn$ corresponding to the first voltage difference $dVs$ is logic "0".

$$dVmn = dVs = In \times Rtr \qquad (1)$$

On the other hand, when the input voltage Vm received by the computing memory cell C(a)mn is the first input voltage VL, and the threshold voltage Vt of the transistor TRmn is the first threshold voltage VtL, since the input voltage Vm is greater than the threshold voltage Vt, the transistor TRmn is in the turned-on state. In this condition, the equivalent impedance of the computing memory cell C(a)mn is substantially equal to the equivalent resistance value Rtr of the transistor TRmn, and the voltage difference dVmn generated by the computing memory cell C(a)mn is the first voltage difference dVs (as in the equation (1)), the corresponding output value Yn is "0".

Furthermore, when the input voltage Vm received by the computing memory cell C(a)mn is the first input voltage VL and the threshold voltage Vt of the transistor TRmn is the second threshold voltage VtH, since the input voltage Vm is less than the threshold voltage Vt, therefore, the transistor TRmn is in a turned-off state (i.e., an open-circuit state). In this situation, the sensing current In only flows through the resistor R(a)mn, and the equivalent impedance of the computing memory cell C(a)mn is substantially equal to the resistor R(a)mn. Accordingly, the voltage difference dVmn generated by the computing memory cell C(a)mn is the second voltage difference dVL, and the second voltage difference dVL is substantially equal to a product of the current value of the sensing current In and the resistor R(a)mn, as shown in the equation (2). Since the resistance value of the resistor R(a)mn is much greater than the equivalent resistance value Rtr of the transistor TRmn, the second voltage difference dVL is much greater than the first voltage difference dVs. The output value Yn corresponding to the second voltage difference dVL is "1".

$$dVmn = dVL = In \times R(a)mn \qquad (2)$$

According to the operation manner of the computing memory cell C(a)mn, Table 1-2 shows a truth table of the output value Yn of the computing memory cell C(a)mn corresponding to the input value inputm and the weight value Wmn.

TABLE 1-2

| inputm | Wmn | |
|---|---|---|
| | 0 | 1 |
| 0 | Yn = 0 | Yn = 0 |
| 1 | Yn = 0 | Yn = 1 |

Referring to Table 1-2, when the input value inputm is "0" and the weight value Wmn is "0" or "1" the corresponding output value Yn is "0". When the input value inputm is "1" and the weight value Wmn is "0", the corresponding output value Yn is "0". When the input value inputm is "1" and the weight value Wmn is "1", the corresponding output value Yn is "1". Accordingly, the computing memory cell C(a)mn may perform a product operation of the input value inputm and the weight value Wmn, and the output value Yn of the computing memory cell C(a)mn is equal to the product of the input value inputm and the weight value Wmn, as shown in equation (3):

$$Yn = inputm \times Wmn \qquad (3)$$

Figure 1B:
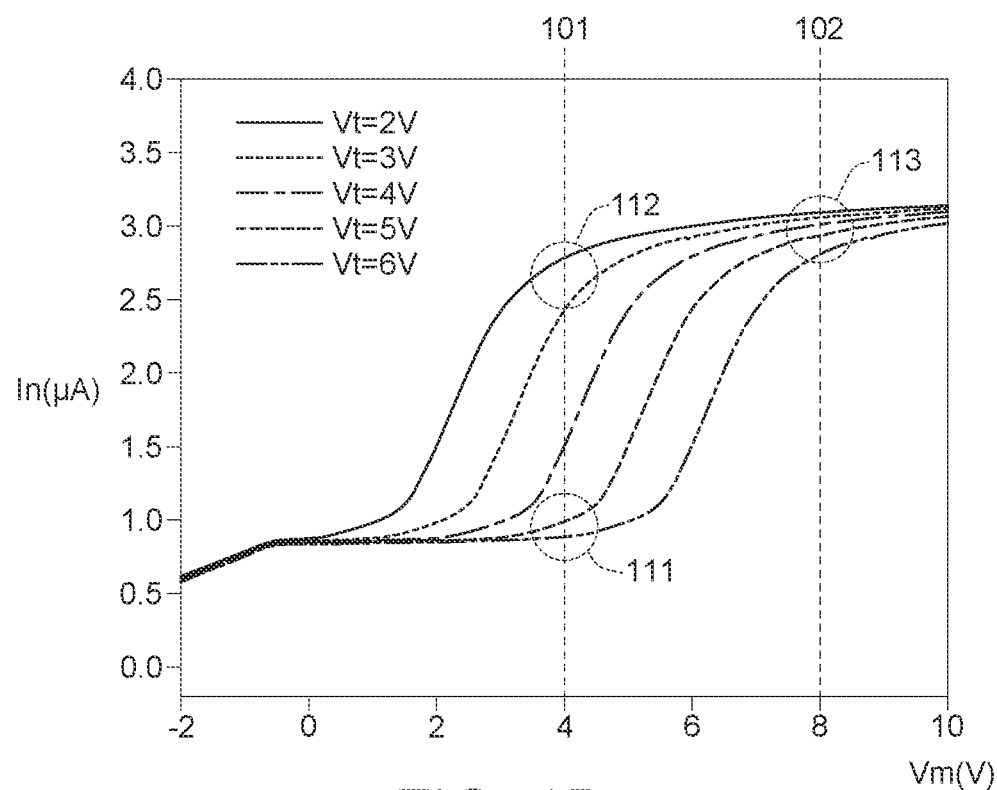
FIG. 1B is a diagram showing the correspondence between the input voltage Vm and the sensing current in of the computing memory cell C(a)mn of FIG. 1A.

FIG. 1B is a diagram showing the correspondence between the input voltage Vm and the sensing current In of the computing memory cell C(a)mn of FIG. 1A. As shown in FIG. 1B, a state line 101 indicates that the input voltage Vm is the first input voltage VL (the first input voltage VL is a low voltage value, e.g. 4V). On the state line 101, when the threshold voltage Vt of the transistor TRmn is the second threshold voltage VtH (the second threshold voltage VtH is a high voltage value, such as 5V or 6V), the computing memory cell C(a)mn is in the state 111. In state 111, the input voltage Vm is less than the threshold voltage Vt, the transistor TRmn is in the turned-off state, hence the sensing current In only flows through the resistor R(a)mn, and the computing memory cell C(a)mn operates in a "resistance state".

On the state line 101, when the threshold voltage Vt of the transistor TRmn is the first threshold voltage VtL (the first threshold voltage VtL is a low voltage value, such as 2V or 3V), the computing memory cell C(a)mn is in the state 112. When in the state 112, the input voltage Vm is greater than the threshold voltage Vt, the transistor TRmn is in the turned-on state, the computing memory cell C(a)mn operates in a "transistor state", and the sensing current In may flow through the transistor TRmn and the resistor R(a)mn.

On the other hand, a state line 102 indicates that the input voltage Vm is the second input voltage VH (the second input voltage VH is a high voltage value, e.g., 8V). On the state line 102, when the threshold voltage Vt of the transistor TRmn is the first threshold voltage VtL or the second threshold voltage VtH, the computing memory cell C(a)mn is in the state 113. When in the state 113, the input voltage Vm is greater than the threshold voltage Vt, the transistor TRmn is in the turned-on state, and the computing memory cell C(a)mn operates in the "transistor state".

Figure 2A:
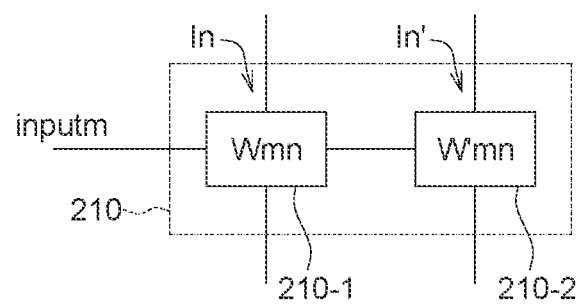
FIG. 2A shows one example of the computing cell according to one embodiment of the application
Figure 2B:
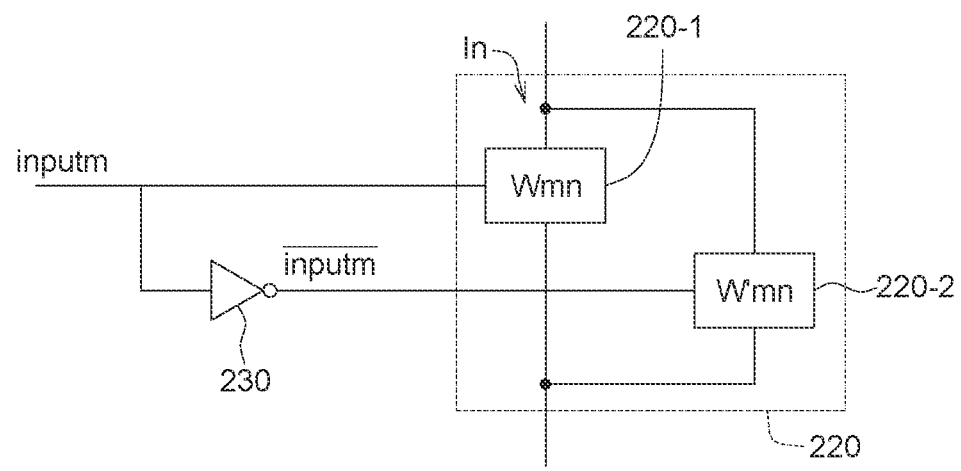
FIG. 2B shows another example of the computing cell according to one embodiment of the application.

FIG. 2A shows one example of the computing cell according to one embodiment of the application. FIG. 2B shows another example of the computing cell according to one embodiment of the application. The computing cells 210 and 220 in FIG. 2A and FIG. 2B may implement an exclusive NOR (XNOR) logic operation.

As shown in FIG. 2A, in one embodiment of the application, the computing cell 210 includes two computing memory cells 210-1 and 210-2. For example but not limited by, the computing memory cells 210-1 and 210-2 may be implemented by the computing memory cell C(a)mn in FIG. 1A. The transistors of the computing memory cells 210-1 and 210-2 receive the same input voltage (i.e. coupled to the same word line) and the computing memory cells 210-1 and 210-2 are coupled to different bit lines.

Similarly, as shown in FIG. 2B, in one embodiment of the application, the computing cell 220 includes two computing memory cells 220-1 and 220-2. For example but not limited by, the computing memory cells 220-1 and 220-2 may be implemented by the computing memory cell C(a)mn in FIG. 1A. Further, in FIG. 23, the inverter 230 may invert the input value inputm into inputm.

In FIG. 2A, Wmn and W'mn have the same weight value. That is, the weight value Wmn stored in the computing memory cell 210-1 is the same as the weight value W'mn stored in the computing memory cell 210-2. However, the threshold voltage Vt of the computing memory cell 210-1 has a value of the first threshold voltage VtL or the third threshold voltage VtM while the threshold voltage Vt of the computing memory cell 210-2 has a value of the third threshold voltage VtM of the second threshold voltage VtH, wherein VtH>VtM>VtL.

When the threshold voltage Vt of the computing memory cell 210-1 is the first threshold voltage VtL, the weight value Wmn of the computing memory cell 210-1 is logic "0". When the threshold voltage Vt of the computing memory cell 210-1 is the third threshold voltage VtM, the weight value Wmn of the computing memory cell 210-1 is logic "1". When the threshold voltage Vt of the computing memory cell 210-2 is the third threshold voltage VtM, the weight value W'mn of the computing memory cell 210-2 is logic "0". When the threshold voltage Vt of the computing memory cell 210-2 is the second threshold voltage VtH, the weight value Winn of the computing memory cell 210-2 is logic "1".

When the input voltage Vm of the computing memory cells 210-1 and 210-2 are between VtH and VtM (VtH>Vm>VtM), the input value inputm is logic "0"; and when the input voltage of the computing memory cells 210-1 and 210-2 is between VtM and VtL (VtM>Vm>VtL), the input value inputm is logic "1".

The computing memory cells 220-1 and 220-2 of FIG. 2B are similar and thus details thereof is omitted.

Figure 3:
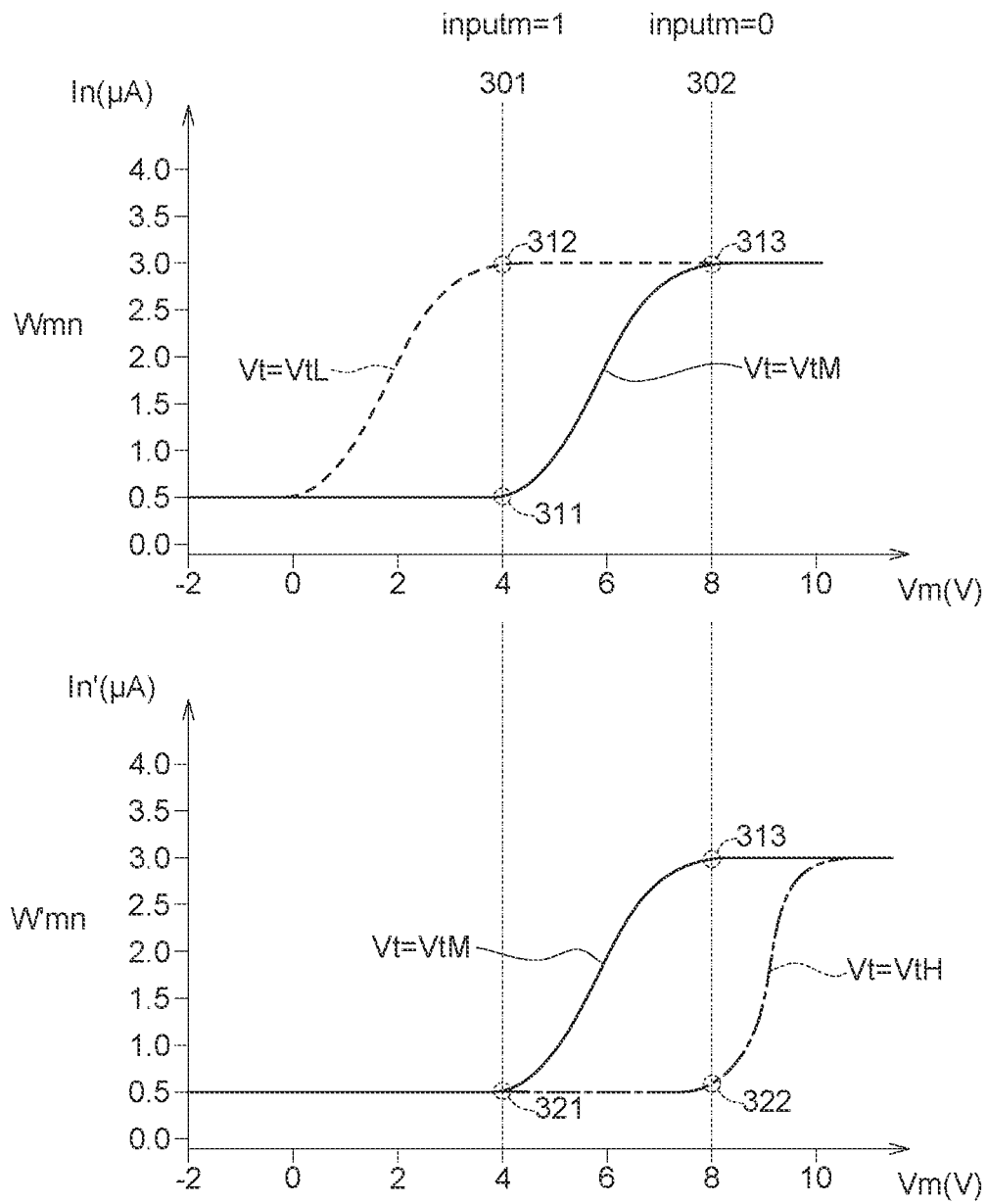
FIG. 3 is a diagram showing the correspondence between the input voltage Vm and the sensing current In (or In') of the computing memory cells.

FIG. 3 is a diagram showing the correspondence between the input voltage Vm and the sensing current In (or In') of the computing memory cells 210-1 and 210-2. As shown in FIG. 3, as for the computing memory cells 210-1 and 210-2, the state line 301 indicates that the input voltage Vm is the first input voltage VL (the input value inputm is logic "1"); and the state line 302 indicates that the input voltage Vm is the second input voltage VH (the input value inputm is logic "0").

On the state line 301, as for the computing memory cell 210-1, when the threshold voltage Vt of the transistor TRmn is the third threshold voltage VtM, the computing memory cell 210-1 is on the state 311. On the state 311, the input voltage Vm is lower than the threshold voltage Vt, the transistor TRmn is in the turned-off state and the computing memory cell 210-1 operates in a high resistance state (HR).

On the state line 301, as for the computing memory cell 210-1, when the threshold voltage Vt of the transistor TRmn is the first threshold voltage VtL, the computing memory cell 210-1 is on the state 312. On the state 312, the input voltage Vm is higher than the threshold voltage Vt, the transistor TRmn is in the turned-on state and the computing memory cell 210-1 operates in a low resistance state (LR).

On the state line 302, as for the computing memory cell 210-1, when the threshold voltage Vt of the transistor TRmn is the first threshold voltage VtL or the third threshold voltage VtM, the computing memory cell 210-1 is on the state 313. On the state 313, the input voltage Vm is higher than the threshold voltage Vt, the transistor TRmn is in the turned-on state and the computing memory cell 210-1 operates in the low resistance state (LR).

On the state line 301, as for the computing memory cell 210-2, when the threshold voltage Vt of the transistor TRmn is the third threshold voltage VtM or the second threshold voltage VtH, the computing memory cell 210-2 is on the state 321. On the state 321, the input voltage Vm is lower than the threshold voltage Vt, the transistor TRmn is in the turned-off state and the computing memory cell 210-2 operates in the high resistance state (HR).

On the state line 302, as for the computing memory cell 210-2, when the threshold voltage Vt of the transistor TRmn is the second threshold voltage VtH, the computing memory cell 210-2 is on the state 322. On the state 322, the input voltage Vm is lower than the threshold voltage Vt, the transistor TRmn is in the turned-off state and the computing memory cell 210-2 operates in the high resistance state (HR).

On the state line 302, as for the computing memory cell 210-2 when the threshold voltage Vt of the transistor TRmn is the third threshold voltage VtM, the computing memory cell 210-2 is on the state 323. On the state 323, the input voltage Vm is higher than the threshold voltage Vt, the transistor TRmn is in the turned-on state and the computing memory cell 210-2 operates in the low resistance state (LR).

Thus, for the computing cell 210, Table 1-3 shows a truth table of the output value Yn of the computing cell 210 corresponding to the input value inputm and the weight values Wmn W'mn (Wmn=W'mn).

TABLE 1-3

| inputm | Y = AND(inputm, Wmn) | | Y' = AND(NOT(inputm), NOT(W'mn)) | |
|---|---|---|---|---|
|  | Wmn = 0 (VtL) | Wmn = 1 (VtM) | W'mn = 0 (VtM) | W'mn = 1 (VtH) |
| 0 (VtH > Vm > VtM) | "0", LR | "0", LR | "1", LR | "0", HR |
| 1 (VtM > Vm > VtL) | "0", LR | "1", HR | "0", HR | "0", HR |

From logic operations, XNOR(A,B) is equivalent as: XNOR(A,B)=AND(A,B)+AND(NOT(A),NOT(B)). That is, the logic operation XNOR is rewritten as the logic operation OR, two logic operations AND and two logic operations NOT.

From the table 1-3, in the computing cell 210, the computing memory cell 210-1 performs the logic operation AND(A,B), and the computing memory cell 210-2 performs the logic operation AND(NOT(A),NOT(B)). The operation result of the logic operation AND(A,B) from the computing memory cell 210-1 and the operation result of the logic operation AND(NOT(A),NOT(B)) from the computing memory cell 210-2 are added by the logic operation OR to generate the XNOR operation result.

Further, as for the operation result of the logic operation AND(A,B) from the computing memory cell 210-1, the high resistance state (HR) is logic "1" while the low resistance state (LR) is logic "0". As for the operation result of the logic operation AND(NOT(A),NOT(B)) from the computing memory cell 210-2, the low resistance state (LR) is logic "1" while the high resistance state (HR) is logic "0".

In one embodiment of the application, how to implement the logic operation result sum-of-XNOR "$\Sigma_m$XNOR(Inputm, Wmn)" in the NAND memory structure is described.

From logic operations, "$\Sigma_m$XNOR(Inputm, Wmn)" may be expressed as the equation (4).

$$\Sigma_m XNOR(\text{Inputm},Wmn)=\Sigma_m(\text{AND}(\text{Inputm},Wmn)+\text{AND}(\text{NOT}(\text{Inputm}),\text{NOT}(W'mn))=\Sigma_m \text{AND}(\text{Inputm},Wmn)+\Sigma_m \text{AND}(\text{NOT}(\text{Inputm}),\text{NOT}(W'mn)) \quad (4)$$

That is, in one embodiment of the application, a plurality of computing cells 210 are cascaded in series, wherein the computing memory cells 210-1 of the computing cells 210 are cascaded in series and the computing memory cells 210-2 of the computing cells 210 are cascaded in series.

The cascaded computing memory cells 210-1 generate the logic operation result "$\Sigma_m$AND(Inputm, Wmn)" while the cascaded computing memory cells 210-2 generate the logic operation result "$\Sigma_m$AND(NOT(Inputm),NOT(W'mn))". The two logic operations results are performed by logic add (OR) to generate the logic operation result sum-of-XNOR "$\Sigma_m$XNOR(Inputm, Wmn)".

Figure 4:
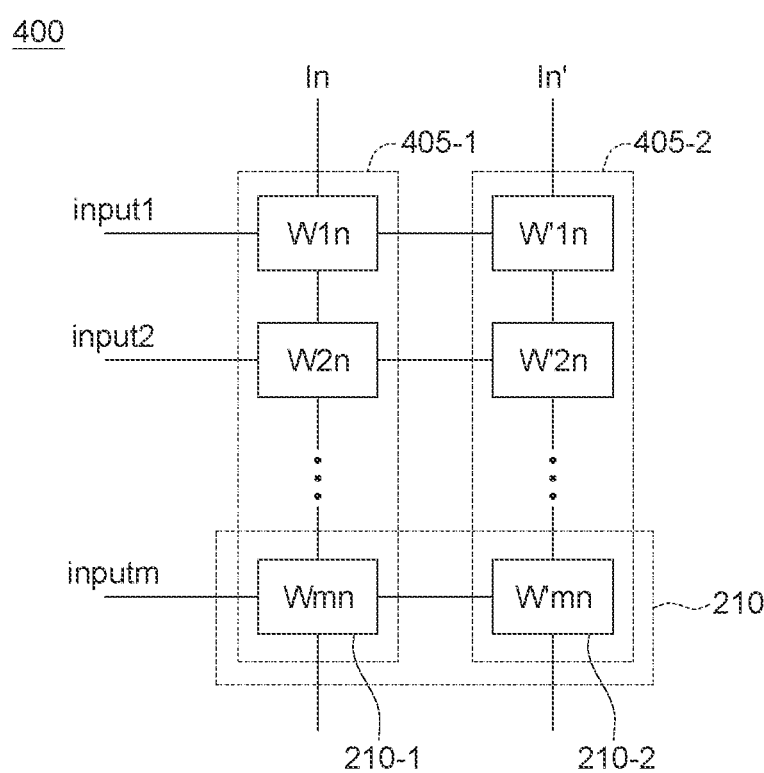
FIG. 4 shows implementation of the logic operation sum-of-XNOR "$\Sigma_m$XNOR(Inputm, Wmn)" the NAND memory structure according to one embodiment of the application.

FIG. 4 shows implementation of the logic operation sum-of-XNOR "$\Sigma_m$XNOR(Inputm, Wmn)" the NAND memory structure according to one embodiment of the application. As shown in FIG. 4, the memory array 400 includes a plurality of the computing cells 210 cascaded in series. The computing memory cells 210-1 cascaded in series store the weight values W1n~Wmn; and the computing memory cells 210-2 cascaded in series store the weight values W'1n~W'mn, wherein W1n=W'1n, . . . , Wmn=W'mn. The computing memory cells 210-1 cascaded in series form a first computing memory cell string 405-1; and the computing memory cells 210-2 cascaded in series form a second computing memory cell string 405-2.

The computing memory cells 210-1 cascaded in series receive the input values input1~inputm and similarly, the computing memory cells 210-2 cascaded in series receive the input values input1~inputm.

The computing memory cells 210-1 cascaded in series generate the sensing current In as: In=$\Sigma_m$AND(Inputm, Wmn) and the computing memory cells 210-2 cascaded in series generate the sensing current In' as: I'n=$\Sigma_m$AND(NOT(Inputm),NOT(W'mn)).

In one embodiment of the application, the total resistance value of the cascaded computing memory cells 210-1 (the first computing memory cell string 405-1) is measured while the total resistance value of the cascaded computing memory cells 210-2 (the second computing memory cell string 405-2) is also measured. A number N_HR_A indicating the cell number of the cascaded computing memory cells 210-1 in the high resistance state (HR) is counted (for the AND (A,B) operation performed by the computing memory cell 210-1, the high resistance state (HR) is logic "1"), and the number N_HR_A also indicates $\Sigma_m$AND(Inputm, Wmn). The number N_HR_A is also referred as a high-resistance cell number. Similarly, a number N_LR_B indicating the cell number of the cascaded computing memory cells 210-2 in the low resistance state (LR) is counted (for the AND (NOT(A),NOT(B)) operation performed by the computing memory cell 210-2, the low resistance state (LR) is logic "1"), and the number N_LR_B also indicates $\Sigma_m$AND(NOT(Inputm),NOT(W'mn)). The number N_LR_B is also referred as a low-resistance cell number.

Thus, in one embodiment of the application, the logic operation result sum-of-XNOR $\Sigma_m$XNOR(Inputm, Wmn) is expressed as the equation (5):

$$\Sigma_m XNOR(Inputm, Wmn) = N\_HR\_A + N\_LR\_B = N\_HR\_A + (N - N\_HR\_B) = N + (N\_HR\_A - N\_HR\_B) \quad (5)$$

In the equation (5), "N" indicates the cell number of the cascaded computing memory cells 210-1 (or 210-2) the number N_HR_B indicating the cell number of the cascaded computing memory cells 210-2 in the high resistance state (HR).

Thus, in one embodiment of the application, based on the respective number N_HR_A and N_HR_B indicating the cascaded computing memory cells 210-1 and 210-2 in the high resistance state (HR), the logic operation result sum-of-XNOR $\Sigma_m$XNOR(Inputm, Wmn) is generated.

Further, in one embodiment of the application, based on a number difference "(N_HR_A−N_HR_B)" and the total cell number (N) of the cascaded computing memory cells 210-1 (or 210-2), the logic operation result sum-of-XNOR $\Sigma_m$XNOR(Inputm, Wmn) is generated.

That is, in FIG. 4, based on a total logic "1" (predetermined logic value) number of the cascaded computing memory cells 210-1 and 210-2, the logic operation result sum-of-XNOR $\Sigma_m$XNOR(Inputm, Wmn) is generated.

In one embodiment of the application, how to implement the logic operation result sum-of-XNOR "$\Sigma_m$XNOR(Inputm, Wmn)" in the NOR memory structure is described.

Figure 5:
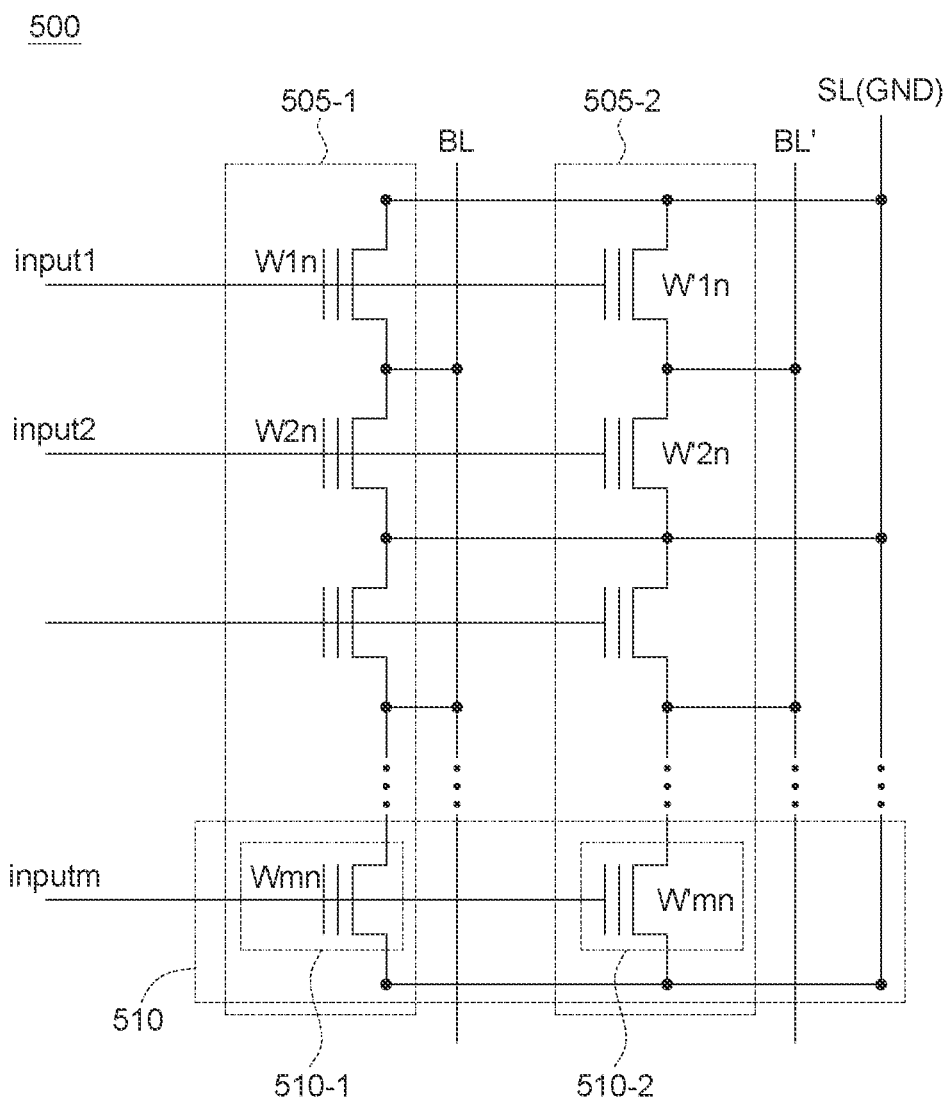
FIG. 5 shows implementation of the logic operation sum-of-XNOR "$\Sigma_m$XNOR(Inputm, Wmn)" in the NOR memory structure according to one embodiment of the application.

FIG. 5 shows implementation of the logic operation sum-of-XNOR "$\Sigma_m$XNOR(Inputm, Wmn)" in the NOR memory structure according to one embodiment of the application. As shown in FIG. 5, the memory array 500 includes a plurality of the computing cells 510 cascaded in series. Each of the computing cells 510 includes two computing memory cells 510-1 and 510-2, The computing memory cells 510-1 of the computing cells 510 are cascaded in series; and the computing memory cells 510-2 of the computing cells 510 are cascaded in series. The cascaded computing memory cells 510-1 form a first computing memory cell string 505-1; and the cascaded computing memory cells 510-2 form a second computing memory cell string 505-2.

The computing memory cells 510-1 cascaded in series store the weight values W1n~Wmn; and the computing memory cells 510-2 cascaded in series store the weight values W'1n~W'mn, wherein W1n=W1n, . . . , Wmn=W'mn.

The computing memory cells 510-1 cascaded in series receive the input values input1~inputm and similarly, the computing memory cells 510-2 cascaded in series receive the input values input1~inputm.

The threshold voltage Vt of the computing memory cell 510-1 is either the first threshold voltage VtL or the third threshold voltage VtM, and the threshold voltage Vt of the computing memory cell 510-2 is either the third threshold voltage VtM or the second threshold voltage VtH, wherein VtH>VtM>VtL.

When the threshold voltage Vt of the computing memory cell 510-1 is the first threshold voltage VtL, the computing memory cell 510-1 stores the weight value as logic "0". When the threshold voltage Vt of the computing memory cell 510-1 is the third threshold voltage VtM, the computing memory cell 510-1 stores the weight value as logic "1". When the threshold voltage Vt of the computing memory cell 510-2 is the third threshold voltage VtM, the computing memory cell 510-2 stores the weight value as logic "0". When the threshold voltage Vt of the computing memory cell 510-2 is the second threshold voltage VtH, the computing memory cell 510-2 stores the weight value as logic "1".

When the input voltage Vm of the computing memory cells 510-1 and 510-2 is between VtH and VtM (VtH>Vm>VtM), the input value inputm is logic "0"; and when the input voltage Vm of the computing memory cells 510-1 and 510-2 is between VtM and VtL. (VtM>Vm>VtL), the input value inputm is logic "1".

Thus, for the computing cell 510, table 1-4 shows a truth table of the output value Yn of the computing cell 510 corresponding to the input value inputm and the weight values Wmn, W'mn).

TABLE 1-4

| inputm | Y = AND(inputm, Wmn) | | Y' = AND(NOT(inputm), NOT(W'mn)) | |
|---|---|---|---|---|
| | Wmn = 0 (VtL) | Wmn = 1 (VtM) | W'mn = 0 (VtM) | W'mn = 1 (VtH) |
| 0 (VtH > Vm > VtM) | "0", ON | "0", ON | "1", ON | "0", OFF |
| 1 (VtM > Vm > VtL) | "0", ON | "1", OFF | "0", OFF | "0", OFF |

Further, as for the AND(A,B) operation performed by the computing memory cell 510-1, the turned-off state (OFF) is as logic "1" while the turned-on state (ON) is as logic "0". As for the AND(NOT(A),NOT(B)) operation performed by the computing memory cell 510-2, the turned-on state (ON) is as logic "1" while the turned-off state (OFF) is as logic "0".

The cascaded computing memory cells 510-1 generate In=$\Sigma_m$AND(Inputm, Wmn) while the cascaded computing memory cells 510-2 generate I'n=$\Sigma_m$AND(NOT(Inputm), NOT (W'mn)).

In one embodiment of the application, the total current from the cascade computing memory cells 510-1 (i.e. the first computing memory cell string 505-1) is measured to obtain a turned-off cell number N_OFF_A of the computing memory cells 510-1. The turned-on cell number N_OFF_A indicates $\Sigma_m$AND(Inputm,Wmn). Because N=N_OFF_A+N_ON_A, measuring the total current of the cascaded computing memory cells 510-1 (i.e. the first computing memory cell string 505-1) also generates a turned-on cell number N_ON_A. The turned-on cell number N_ON_A is also referred as a first turned-on cell number.

Similarly, in one embodiment of the application, the total current from the cascaded computing memory cells 510-2 (i.e. the second computing memory cell string 505-2) is measured to obtain a turned-on cell number N_ON_B of the computing memory cells 510-2. The turned-on cell number N_ON_B indicates $\Sigma_m$AND(Inputm), NOT(W'mn)). The turned-on cell number N_ON_B is also referred as a second turned-on cell number.

In one embodiment of the application, the logic operation result sum-of-XNOR $\Sigma_m$XNOR(Inputm,Wmn) is expressed as the equation (6):

$$\Sigma_m XNOR(Inputm, Wmn) N\_OFF\_A + N\_ON\_B = N + (N\_ON\_B - N\_ON\_A) \quad (6)$$

In one embodiment of the application, based on a number difference (N_ON_B−N_ON_A) between the turned-on cell number N_ON_A and N_ON_B of the computing memory cells 510-1 and 510-2 and a total cell number (N) of the cascaded computing memory cells 510-1 (or 510-2), the logic operation result sum-of-XNOR $\Sigma_m$XNOR(Inputm, Wmn) is calculated.

That is, in FIG. 5, based on the total logic "1" cell number of the cascaded computing memory cells 510-1 and 510-2, the logic operation result sum-of-XNOR $\Sigma_m$XNOR(Inputm, Wmn) is calculated.

Figure 6:
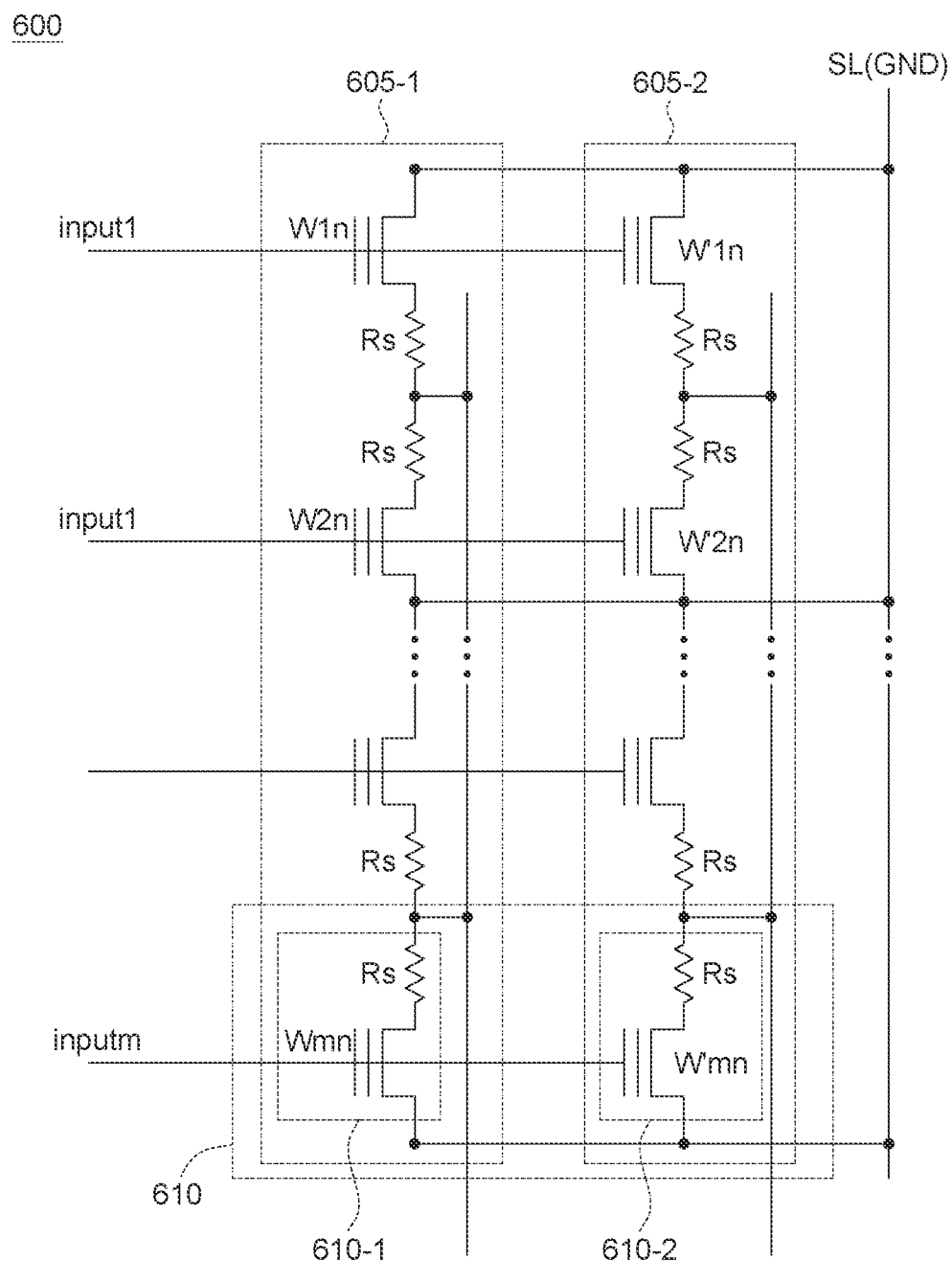
FIG. 6 shows implementation of the logic operation m-of-XNOR "$\Sigma_m$XNOR(Inputm, Wmn)" in the NOR memory structure according to one embodiment of the application.

FIG. 6 shows implementation of the logic operation sum-of-XNOR "$\Sigma_m$XNOR(Inputm,Wmn)" in the NOR memory structure according to one embodiment of the application. As shown in FIG. 6, the memory array 600 includes a plurality of the computing cells 610 cascaded in series. Each of the computing cells 610 includes two computing memory cells 610-1 and 610-2. The computing memory cell 610-1 includes a transistor TRmn and a resistor Rs connected in series. The computing memory cell 610-2 includes a transistor TRmn and a resistor Rs connected in series. The computing memory cells 610-1 of the computing cells 610 are cascaded in series; and the computing memory cells 610-2 of the computing cells 610 are cascaded in series. The cascaded computing memory cells 610-1 form a first computing memory cell string 605-1; and the cascaded computing memory cells 610-2 form a second computing memory cell string 605-2.

The computing memory cells 610-1 cascaded in series store the weight values W1n~Wmn; and the computing memory cells 610-2 cascaded in series store the weight values W'1n~W'mn, wherein W1n=W'1n, . . . , Wmn=W'mn.

The computing memory cells 610-1 cascaded in series receive the input values input1-inputm and similarly, the computing memory cells 610-2 cascaded in series receive the input values input1~inputm.

The threshold voltage Vt of the computing memory cell 610-1 is either the first threshold voltage VtL or the third threshold voltage VtM, and the threshold voltage Vt of the computing memory cell 610-2 is either the third threshold voltage VtM or the second threshold voltage VtH, wherein VtH>VtM>VtL.

When the threshold voltage Vt of the computing memory cell 610-1 is the first threshold voltage VtL, the computing memory cell 610-1 stores the weight value as logic "0". When the threshold voltage Vt of the computing memory cell 610-1 is the third threshold voltage VtM, the computing memory cell 610-1 stores the weight value as logic "1". When the threshold voltage Vt of the computing memory cell 610-2 is the third threshold voltage VtM, the computing memory cell 610-2 stores the weight value as logic "0". When the threshold voltage Vt of the computing memory cell 610-2 is the second threshold voltage VtH, the computing memory cell 610-2 stores the weight value as logic "1".

When the input voltage Vm of the computing memory cells 610-1 and 610-2 is between VtH and VtM (VtH>Vm>VtM), the input value inputm is logic "0"; and when the input voltage Vm of the computing memory cells 610-1 and 610-2 is between VtM and VtL (VtM>Vm>VtL), the input value inputm is logic "1".

The source s of the transistor TRmn is coupled to the source line SL (the source line SL is further grounded), the drain d of the transistor TRmn is coupled to the resistor Rs and the gate g of the transistor TRmn receives the input voltage. The other terminal of the resistor Rs is coupled to the bit line BL or BL'.

When the transistor TRmn is turned on, the equivalent resistance of the computing memory cell 610-1 or 610-2 is equal to the resistor Rs (i.e. a low resistance state); and when the transistor TRmn is turned off, the equivalent resistance of the computing memory cell 610-1 or 610-2 is equal to high resistance.

Thus, for the computing cell 610, table 1-5 shows a truth table of the output value Yn of the computing cell 610 corresponding to the input value inputm and the weight values Wmn, W'mn (Wmn=W'mn).

TABLE 1-5

| inputm | Y = AND(inputm, Wmn) | | Y' = AND(NOT(inputm), NOT(W'mn)) | |
|---|---|---|---|---|
| | Wmn = 0 (VtL) | Wmn = 1 (VtM) | W'mn = 0 (VtM) | W'mn = 1 (VtH) |
| 0 (VtH > Vm > VtM) | "0", Rs | "0", Rs | "1", Rs | "0", OFF |
| 1 (VtM > Vm > VtL) | "0", Rs | "1", OFF | "0", OFF | "0", OFF |

Further, as for the AND(A,B) operation performed by the computing memory cell 610-1, the turned-off state (OFF) is as logic "1" while the low resistance state (Rs) is as logic "0". As for the AND(NOT(A),NOT(B)) operation performed by the computing memory cell 610-2, the low resistance state (Rs) is as logic "1" while the turned-off state (OFF) is as logic "0".

The cascaded computing memory cells 610-1 generate In=$\Sigma_m$AND(Inputm, Wmn) while the cascaded computing memory cells 610-2 generate I'n=$\Sigma_m$AND(NOT(Inputm), NOT(W'mn)).

In one embodiment of the application, the turned-off cell number on the cascaded computing memory cells 610-1 (i.e. the first computing memory cell string 605-1) is measured to obtain a turned-off cell number N_OFF_A. The turned-off cell number N_OFF_A indicates $\Sigma_m$AND(Inputm, Wmn). The turned-off cell number N_OFF_A is also referred as a turned-off cell number. N_OFF_A=N−N_RS_A, wherein the number N_RS_A indicates the low-resistance cell number on the cascaded computing memory cells 610-1 (i.e. the first computing memory cell string 605-1). Similarly, in one embodiment of the application, the low-resistance cell number on the cascaded computing memory cells 610-2 (i.e. the second computing memory cell string 605-2) is measured to obtain a low-resistance cell number N_RS_B of the computing memory cells 610-2. The low-resistance cell number N_RS_B indicates $\Sigma_m$AND(NOT(Inputm),NOT(W˜mn)).

Thus, in one embodiment of the application, the logic operation result sum-of-XNOR $\Sigma_m$XNOR(Inputm, Wmn) is expressed as the equation (7):

$$\Sigma_m\text{XNOR(Inputm},Wmn)=N\_OFF\_A+N\_RS\_B=(N-RS\_A)+N\_RS\_B=N+(N\_RS\_B-N\_RS\_A) \quad (7)$$

In one embodiment of the application, based on the number difference (N_RS_B−N_RS_A) of the low-resistance cellN_number N_RS_B and N_RS_A of the cascaded computing memory cells 610-1 and 610-2 and the total cell number (N) of the cascaded computing memory cells 610-1 (or 610-2) to generate the logic operation result of sum-of-XNOR $\Sigma_m$XNOR(Inputm, Wmn).

Thus, in FIG. 6, based on the total number of logic "1" cells of the cascaded computing memory cells 610-1 and 610-2, the logic operation result of sum-of-XNOR $\Sigma_m$XNOR(Inputm, Wmn) is generated.

Figure 7:
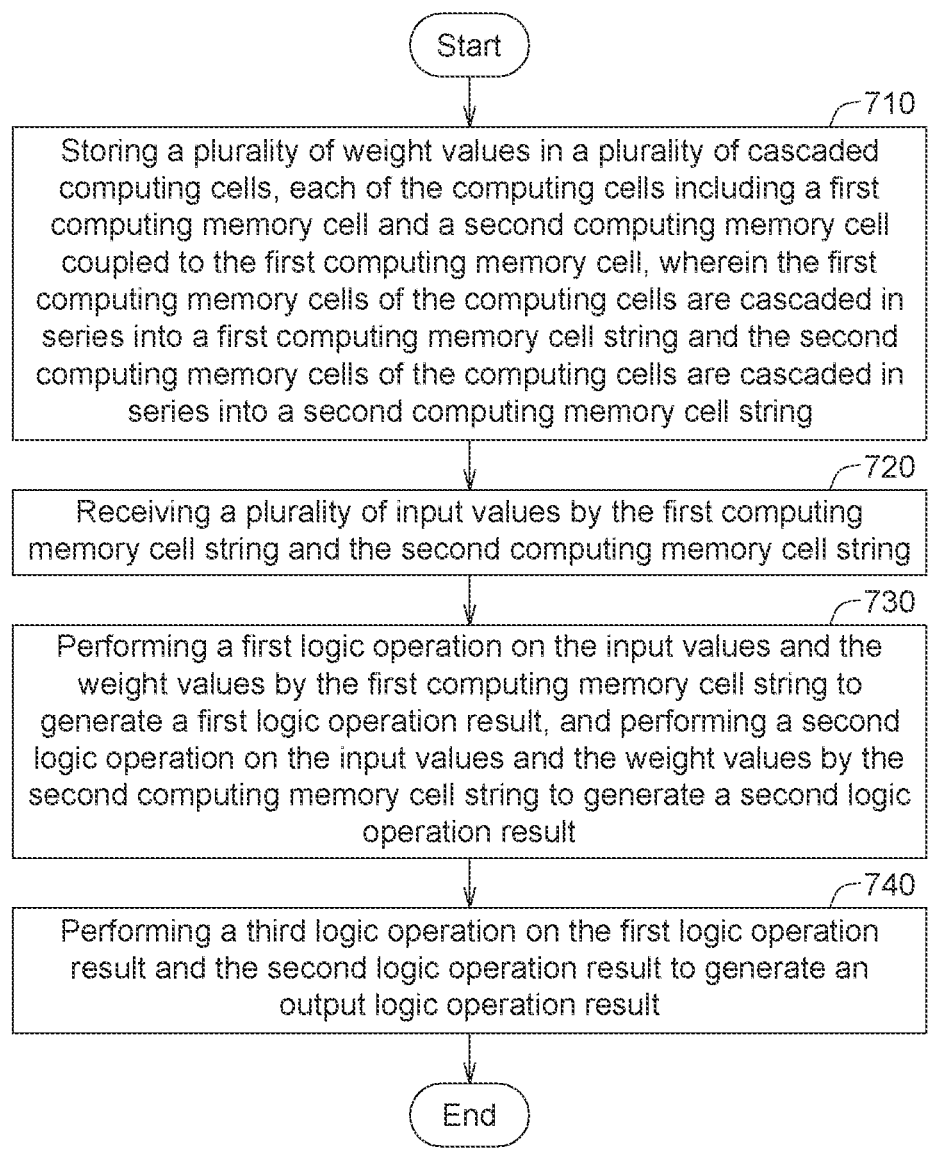
FIG. 7 shows an IMC operation method of the memory device according to one embodiment of the application.

FIG. 7 shows an IMC operation method of the memory device according to one embodiment of the application. As shown in FIG. 7, the IMC operation method of the memory device includes: storing a plurality of weight values in a plurality of cascaded computing cells, each of the computing cells including a first computing memory cell and a second computing memory cell coupled to the first computing memory cell, wherein the first computing memory cells of the computing cells are cascaded in series into a first computing memory cell string and the second computing memory cells of the computing cells are cascaded in series into a second computing memory cell string (710); receiving a plurality of input values by the first computing memory cell string and the second computing memory cell string (720); performing a first logic operation on the input values and the weight values by the first computing memory cell string to generate a first logic operation result, and performing a second logic operation on the input values and the weight values by the second computing memory cell string to generate a second logic operation result (730); and performing a third logic operation on the first logic operation result and the second logic operation result to generate an output logic operation result (740).

Figure 8:
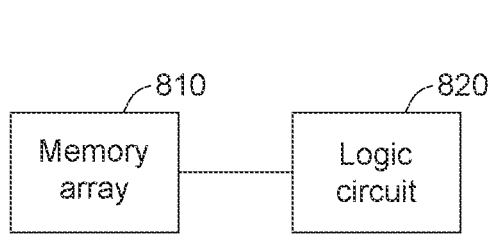
FIG. 8 shows a block diagram of a memory device according to one embodiment of the application.

FIG. 8 shows a block diagram of a memory device 800 according to one embodiment of the application. According to one embodiment of the application, the memory device 800 includes: a memory array 810 and a logic circuit 820. The memory array 810 is coupled to the logic circuit 820. The memory array is for example the memory array 400, 500 or 600. The logic circuit 820 controls the memory array 810 to implement the above logic operations.

Although the above embodiments are described by taking performing XNOR logic operations as an example, which is not to limit the application. In other possible embodiment of the application, exclusive OR (XOR) logic operations, XNAND logic operations, XAND logic operations and so on are within the spirit and the scope of the application.

From the above embodiments, when the memory device performs IMC logic operations, by hardware structure design, sum-of-logic operations are rapidly calculated. Therefore, the above embodiments may reduce circuit complexity and logic operation power consumption, which facilitates AI operations.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device, comprising:
   a memory array including a plurality of cascaded computing cell, each of the computing cells including a first computing memory cell and a second computing memory cell coupled to the first computing memory cell, wherein the first computing memory cells of the computing cells are cascaded in series into a first computing memory cell string and the second computing memory cells of the computing cells are cascaded in series into a second computing memory cell string; and
   a logic circuit coupled to the memory array,
   the logic circuit is configured for:
      storing a plurality of weight values in the first computing memory cell string and the second computing memory cell string;
      receiving a plurality of input values by the first computing memory cell string and the second computing memory cell string;
      performing a first logic operation on the input values and the weight values by the first computing memory cell string to generate a first logic operation result, and performing a second logic operation on the input values and the weight values by the second computing memory cell string to generate a second logic operation result; and
      performing a third logic operation on the first logic operation result and the second logic operation result to generate an output logic operation result.

2. The memory device according to claim 1, wherein
   a threshold voltage of the first computing memory cell is a first threshold voltage or a third threshold voltage, and a threshold voltage of the second computing memory cell is the third threshold voltage or a second threshold voltage, wherein the second threshold voltage is higher than the third threshold voltage and the third threshold voltage is higher than the first threshold voltage;
   the weight values stored in the first and the second computing memory cells are corresponding to the threshold voltages of the first and the second computing memory cells;
   when the threshold voltage of the first computing memory cell is the first threshold voltage, the first computing memory cell stores the weight value as a first value; and when the threshold voltage of the first computing memory cell is the third threshold voltage, the first computing memory cell stores the weight value as a second value;
   when the threshold voltage of the second computing memory cell is the third threshold voltage, the second computing memory cell stores the weight value as the first value; and when the threshold voltage of the second computing memory cell is the second threshold voltage, the second computing memory cell stores the weight value as the second value;

the first and the second computing memory cells both receive an input voltage corresponding to the input value;

when the input voltage received by the first and the second computing memory cells is between the second threshold voltage and the third threshold voltage, the input value is the first value; and when the input voltage received by the first and the second computing memory cells is between the third threshold voltage and the first threshold voltage, the input value is the second value and the first computing memory cell performs a logic AND operation on the input value and the weight value to generate the first logic operation result; and the second computing memory cell performs a logic AND operation on the input value and the weight value to generate the second logic operation result, a logic OR operation is performed on the first logic operation result and the second logic operation result to generate an XNOR logic operation result.

3. The memory device according to claim 2, wherein each of the first and the second computing memory cells includes a transistor and a parallel resistor, the transistor is parallel coupled to the parallel resistor;

the logic circuit measures a total resistance of the first computing memory cell string to count a high-resistance cell number of the first computing memory cell string;

the logic circuit measures a total resistance of the second computing memory cell string to count a low-resistance cell number of the second computing memory cell string; and the logic circuit generates a sum-of XNOR logic operation result based on the high-resistance cell number and the low-resistance cell number.

4. The memory device according to claim 2, wherein each of the first and the second computing memory cells includes a transistor;

the logic circuit measures a total current of the first computing memory cell string to count a first turned-on cell number of the first computing memory cell string;

the logic circuit measures a total current of the second computing memory cell string to count a second turned-on cell number of the second computing memory cell string; and the logic circuit generates a sum-of XNOR logic operation result based on the first turned-on cell number and the second turned-on cell number.

5. The memory device according to claim 2, wherein each of the first and the second computing memory cells includes a transistor and a serial resistor, the transistor is serially coupled to the serial resistor;

the logic circuit measures a total current of the first computing memory cell string to count a turned-off cell number of the first computing memory cell string;

the logic circuit measures a total current of the second computing memory cell string to count a low-resistance cell number of the second computing memory cell string; and the logic circuit generates a sum-of XNOR logic operation result based on the turned-off cell number and the low-resistance cell number.

6. An in-memory-computing (IMC) method for a memory device including:

storing a plurality of weight values in a plurality of cascaded computing cells, each of the computing cells including a first computing memory cell and a second computing memory cell coupled to the first computing memory cell, wherein the first computing memory cells of the computing cells are cascaded in series into a first computing memory cell string and the second computing memory cells of the computing cells are cascaded in series into a second computing memory cell string;

receiving a plurality of input values by the first computing memory cell string and the second computing memory cell string;

performing a first logic operation on the input values and the weight values by the first computing memory cell string to generate a first logic operation result, and performing a second logic operation on the input values and the weight values by the second computing memory cell string to generate a second logic operation result; and performing a third logic operation on the first logic operation result and the second logic operation result to generate an output logic operation result.

7. The IMC method according to claim 6, wherein measuring a total resistance of the first computing memory cell string to count a high-resistance cell number of the first computing memory cell string;

measuring a total resistance of the second computing memory cell string to count a low-resistance cell number of the second computing memory cell string; and generating a sum-of XNOR logic operation result based on the high-resistance cell number and the low-resistance cell number.

8. The IMC method according to claim 6, wherein measuring a total current of the first computing memory cell string to count a first turned-on cell number of the first computing memory cell string;

measuring a total current of the second computing memory cell string to count a second turned-on cell number of the second computing memory cell string; and generating a sum-of XNOR logic operation result based on the first turned-on cell number and the second turned-on cell number.

9. The IMC method according to claim 6, wherein measuring a total current of the first computing memory cell string to count a turned-off cell number of the first computing memory cell string;

measuring a total current of the second computing memory cell string to count a low-resistance cell number of the second computing memory cell string; and generating a sum-of XNOR logic operation result based on the turned-off cell number and the low-resistance cell number.

10. A computing cell of a memory device, the computing cell including:

a first and a second computing memory cells coupled to each other, wherein the first and the second computing memory cells both receive an input voltage corresponding to an input value;

a threshold voltage of the first computing memory cell has a first threshold voltage or a third threshold voltage, and a threshold voltage of the second computing memory cell has the third threshold voltage or a second threshold voltage, wherein the second threshold voltage is higher than the third threshold voltage, the third threshold voltage is higher than the first threshold voltage;

both the first and the second computing memory cells store a weight value, the weight value corresponding to the respective threshold voltages of the first and the second computing memory cells;

the first computing memory cell performs a first logic operation on the input value and the weight value to generate a first logic operation result, the second computing memory cell performs a second logic operation on the input value and the weight value to generate a second logic operation result, a third logic operation is performed on the first logic operation result and the second logic operation result to generate an output logic operation result.

11. The computing cell according to claim 10, wherein when the threshold voltage of the first computing memory cell is the first threshold voltage, the first computing memory cell stores the weight value as a first value; and when the threshold voltage of the first computing memory cell is the third threshold voltage, the first computing memory cell stores the weight value as a second value;

when the threshold voltage of the second computing memory cell is the third threshold voltage, the second computing memory cell stores the weight value as the first value; and when the threshold voltage of the second computing memory cell is the second threshold voltage, the second computing memory cell stores the weight value as the second value; and when the input voltage received by the first and the second computing memory cells is between the second threshold voltage and the third threshold voltage, the input value is the first value; and when the input voltage received by the first and the second computing memory cells is between the third threshold voltage and the first threshold voltage, the input value is the second value.

12. The computing cell according to claim 10, wherein each of the first and the second computing memory cells includes a first transistor and a parallel resistor, the first transistor is parallel coupled to the parallel resistor; or
each of the first and the second computing memory cells includes a second transistor; or
each of the first and the second computing memory cells includes a third transistor and a serial resistor, the third transistor is serially coupled to the serial resistor.

\* \* \* \* \*